(12) United States Patent
Abe et al.

(10) Patent No.: US 12,191,420 B2
(45) Date of Patent: Jan. 7, 2025

(54) NITRIDE SEMICONDUCTOR LIGHT EMITTING ELEMENT AND METHOD OF MANUFACTURING SAME

(71) Applicant: NICHIA CORPORATION, Anan (JP)

(72) Inventors: Hiroki Abe, Komatsushima (JP); Tomoya Yamashita, Anan (JP); Kenji Uchida, Anan (JP)

(73) Assignee: NICHIA CORPORATION, Anan (JP)

( * ) Notice: Subject to any disclaimer, the term of this patent is extended or adjusted under 35 U.S.C. 154(b) by 440 days.

(21) Appl. No.: 17/556,599

(22) Filed: Dec. 20, 2021

(65) Prior Publication Data

US 2022/0209067 A1 Jun. 30, 2022

(30) Foreign Application Priority Data

Dec. 24, 2020 (JP) .................................. 2020-215333
Aug. 5, 2021 (JP) .................................. 2021-129229

(51) Int. Cl.
*H01L 33/00* (2010.01)
*H01L 33/32* (2010.01)

(52) U.S. Cl.
CPC .......... *H01L 33/32* (2013.01); *H01L 33/0075* (2013.01)

(58) Field of Classification Search
CPC ..... H01L 33/32; H01L 33/0075; H01L 33/06; H01L 33/325
USPC ......................................................... 257/98
See application file for complete search history.

(56) References Cited

U.S. PATENT DOCUMENTS

| 6,657,234 B1 | 12/2003 | Tanizawa |
| 2005/0067613 A1* | 3/2005 | Kim ................. H01L 29/155 257/14 |
| 2005/0156153 A1 | 7/2005 | Futagawa |
| 2007/0012932 A1 | 1/2007 | Kobayakawa et al. |
| 2008/0308787 A1 | 12/2008 | Lee et al. |
| 2013/0001512 A1 | 1/2013 | Kotani |
| 2013/0001637 A1* | 1/2013 | Fudeta ................. H01L 33/32 257/E33.013 |
| 2013/0228741 A1 | 9/2013 | Fu |

(Continued)

FOREIGN PATENT DOCUMENTS

| JP | 2000-349337 A | 12/2000 |
| JP | 2001-102629 A | 4/2001 |

(Continued)

*Primary Examiner* — Tan N Tran
(74) *Attorney, Agent, or Firm* — Foley & Lardner LLP

(57) ABSTRACT

A nitride semiconductor light emitting element includes: n-side and p-side nitride semiconductor layers; and an active layer. The active layer includes a plurality of well layers and a plurality of barrier layers. The plurality of well layers include first well layers, and second well layers positioned closer to the p-side nitride semiconductor layer than the first well layers. At least one of the plurality of barrier layers positioned between the first well layers and at least one of the plurality of barrier layers positioned between the second well layers respectively include a first barrier layer containing an n-type impurity, and a second barrier layer, wherein a concentration of the n-type impurity in the second barrier layer is lower than a concentration of the n-type impurity in the first barrier layer, and wherein the second barrier layer is positioned closer to the p-side nitride semiconductor layer than the first barrier layer.

7 Claims, 2 Drawing Sheets

(56) References Cited

U.S. PATENT DOCUMENTS

| | | |
|---|---|---|
| 2014/0048771 A1 | 2/2014 | Takahashi et al. |
| 2016/0343900 A1* | 11/2016 | Obuchi .................. H01L 33/32 |
| 2020/0381898 A1 | 12/2020 | Kawasumi et al. |

FOREIGN PATENT DOCUMENTS

| | | |
|---|---|---|
| JP | 2003-229645 A | 8/2003 |
| JP | 2004-022989 A | 1/2004 |
| JP | 2005-109425 A | 4/2005 |
| JP | 2005-129923 A | 5/2005 |
| JP | 2006-013463 A | 1/2006 |
| JP | 2008-311658 A | 12/2008 |
| JP | 2009-182347 A | 8/2009 |
| JP | 2011-187621 A | 9/2011 |
| JP | 2013-012684 A | 1/2013 |
| JP | 2016-219547 A | 12/2016 |
| WO | WO-2013/132812 A1 | 9/2013 |
| WO | WO-2019/106931 A1 | 6/2019 |

\* cited by examiner

NITRIDE SEMICONDUCTOR LIGHT EMITTING ELEMENT AND METHOD OF MANUFACTURING SAME

CROSS-REFERENCE TO RELATED APPLICATION

This application claims priority to Japanese Patent Application No. 2020-215333 filed on Dec. 24, 2020, and Japanese Patent Application No. 2021-129229 filed on Aug. 5, 2021, the disclosures of which are hereby incorporated by reference in their entireties.

BACKGROUND

The present disclosure relates to a nitride semiconductor light emitting element and a method of manufacturing the same.

PCT Publication No. WO 2019/106931 discloses a semiconductor light emitting element that includes an n-type semiconductor layer, an interlayer having an active layer, and a p-type semiconductor layer, in which barrier layers are interposed between well layers.

SUMMARY

There is room for improvement in the light emission efficiency of the nitride light emitting element described above. Accordingly, one of the objects of the present disclosure is to provide a nitride semiconductor light emitting element with improved light emission efficiency and a method of manufacturing the same.

According to one embodiment of the present disclosure, a nitride semiconductor light emitting element includes an n-side nitride semiconductor layer, a p-side nitride semiconductor layer, and an active layer disposed between the n-side nitride semiconductor layer and the p-side nitride semiconductor layer. The active layer includes a plurality of well layers and a plurality of barrier layers. The plurality of well layers include a plurality of first well layers, and a plurality of second well layers positioned closer to the p-side nitride semiconductor layer than the first well layers. At least one of the plurality of barrier layers positioned between the first well layers and at least one of the plurality of barrier layers positioned between the second well layers respectively include a first barrier layer containing an n-type impurity, and a second barrier layer containing a lower concentration of the n-type impurity than a concentration of the n-type impurity of the first barrier layer, wherein the second barrier layer is positioned closer to the p-side nitride semiconductor layer than the first barrier layer. The n-type impurity concentration of at least one of the first barrier layers positioned between the first well layers is higher than the n-type impurity concentration of at least one of the first barrier layers positioned between the second well layers. An n-type impurity concentration difference between at least one of the first barrier layers and at least one of the second barrier layers positioned between the first well layers is greater than an n-type impurity concentration difference between at least one of the first barrier layers and at least one of the second barrier layers positioned between the second well layers.

According to another embodiment of the present disclosure, a method of manufacturing a nitride semiconductor light emitting element includes: forming an n-side nitride semiconductor layer; subsequent to the forming of the n-side nitride semiconductor layer, forming an active layer, the forming of the active layer including forming a plurality of well layers and forming a plurality of barrier layers; and subsequent to the forming of the active layer, forming a p-side nitride semiconductor layer, wherein the forming of the plurality of well layers includes forming a plurality of first well layers and forming a plurality of second well layers positioned closer to the p-side nitride semiconductor layer than the first well layers, the forming of the plurality of barrier layers includes in each instance: forming a first barrier layer containing an n-type impurity, and forming a second barrier layer containing a lower concentration of the n-type impurity than a concentration of the n-type impurity of the first barrier layer and positioned closer to the p-side nitride semiconductor layer than first barrier layer, wherein at least one of the first barrier layers positioned between the first well layers is formed to have a higher n-type impurity concentration than an n-type impurity concentration of at least one of the first barrier layers positioned between the second well layers, and the barrier layers are formed such that an n-type impurity concentration difference between at least one of the first barrier layers and at least one of the second barrier layers positioned between the first well layers is larger than an n-type impurity concentration difference between at least one of the first barrier layers and at least one of the second barrier layers positioned between the second well layers.

According to another embodiment of the present disclosure, a method of manufacturing a nitride semiconductor light emitting element includes: forming an n-side nitride semiconductor layer; subsequent to forming the n-side nitride semiconductor layer, forming an active layer, the forming of the active layer including forming a plurality of well layers and forming a plurality of barrier layers; and subsequent to forming the active layer, forming a p-side nitride semiconductor layer, wherein the forming of the plurality of well layers includes forming a plurality of first well layers and forming a plurality of second well layers that are positioned closer to the p-side nitride semiconductor layer than the first well layers, the forming of the plurality of barrier layers includes in each instance: forming a first barrier layer while supplying an n-type impurity gas; and forming a second barrier layer positioned closer to the p-side semiconductor layer than the first barrier layer while supplying an n-type impurity gas set at a lower flow rate than a flow rate for forming the first barrier layer, wherein the n-type impurity gas flow rate for forming at least one of the first barrier layers positioned between the first well layers is set higher than the n-type impurity gas flow rate for forming at least one of the first barrier layers positioned between the second well layers.

A nitride semiconductor light emitting element according to the present disclosure constructed as above may have improved light emission efficiency.

A method of manufacturing a nitride semiconductor light emitting element according to the present disclosure may allow for the manufacture of a high light emission efficiency nitride semiconductor light emitting element.

DETAILED DESCRIPTION

Figure 1:
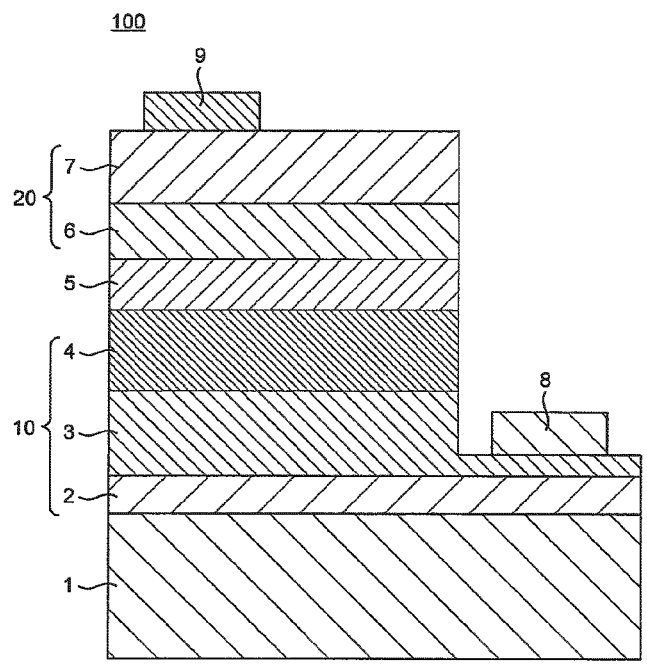
FIG. 1 is a cross-sectional view of the structure of a nitride semiconductor light emitting element according to the present disclosure.

With respect to a semiconductor light emitting element that includes an active layer having a multiple quantum well structure in which well layers and barrier layers are alternately stacked, doping the barrier layers with an n-type impurity is believed to reduce the resistance of the light emitting element to thereby reduce the forward voltage. However, an increased n-type impurity concentration of the barrier layers tends to facilitate the consumption of the holes supplied by the p-side semiconductor layer by the well layers positioned closer to the p-side semiconductor layer in the active layer. This consequently makes it difficult to increase the light emission efficiency because holes cannot be readily supplied to the well layers near the center of the active layer.

Embodiments of the present disclosure were developed as a result of diligent study based on the knowledge described above, and may provide light emitting elements having improved light emission efficiency as a whole by adjusting the n-type impurity concentrations of the barrier layers.

A specific structure of the active layer that can effectively function in this manner has a plurality of stacks that include well layers and barrier layers, in which the well layers include a plurality of first well layers positioned closer to the n-side nitride semiconductor layer and a plurality of second well layers positioned closer to the p-side nitride semiconductor layer, and the barrier layers in each stack include a first barrier layer and a second barrier layer that is positioned closer to the p-side nitride semiconductor layer than the first barrier layer.

The first barrier layers include an n-type impurity. With respect to the n-type impurity concentrations of the first barrier layers, the n-type impurity concentrations of the first barrier layers positioned between the first well layers are set higher than the n-type impurity concentrations of the first barrier layers positioned between the second well layers. Furthermore, the n-type impurity concentrations of the second barrier layers are set lower than those of the first barrier layers.

With respect to the relationship between the first and second barrier layers in terms of the n-type impurity concentration, the n-type impurity concentration difference between at least one of the first barrier layers and at least one of the second barrier layers positioned between the first well layers is set higher than the n-type impurity concentration difference between at least one of the first barrier layers and at least one of the second barrier layers positioned between the second well layers. Setting the n-type impurity concentrations in this manner can facilitate the supply of holes to the well layers that are positioned near the center of the active layer. As a result, electron-hole recombination can be efficiently facilitated in the well layers near the center of the active layer; i.e., the well layers that readily contribute to emission of light can be increased and the light emission efficiency can thus be improved. Furthermore, the degradation of the crystallinity of the semiconductor layers can also be lessened and the light emission efficiency can thus be improved.

A more specific embodiment will be explained below. In the nitride semiconductor light emitting elements according to the embodiments described below, the nitride semiconductors that can be used include the group III-V nitride semiconductors ($In_XAl_YGa_{1-X-Y}N$ (0≤X, 0≤Y, X+Y≤1)), those in which B is used for some of the group III elements, and mixed crystals in which the group V element N is replaced with P, As, or Sb. These nitride semiconductor layers can be formed by, for example, metal-organic chemical vapor deposition (MOCVD), hydride vapor phase epitaxy (HVPE), molecular-beam epitaxy (MBE), or the like.

As a nitride semiconductor light emitting element according to any of the embodiments, a nitride semiconductor light emitting element having relatively high In content in the well layers of the active layer and a peak emission wavelength of at least 500 nm (for example, a green light emitting element in which the InGaN well layers having the In percentage of about 20.0~28.0%) will be illustrated for explanation purposes. The peak emission wavelength is not limited to the wavelength described above. In the present specification, when a range is described using numbers such as in A to B, the instance in which the value is A and the instance in which the value is B are included.

Nitride Semiconductor Light Emitting Element

First Embodiment

A nitride semiconductor light emitting element according to a first embodiment of the present disclosure will be explained below with reference to FIG. 1 and FIG. 2. The nitride semiconductor light emitting element 100 according to this embodiment includes a substrate 1, an n-side nitride semiconductor layer 10 disposed on the substrate 1, a p-side nitride semiconductor layer 20, and an active layer 5 positioned between the n-side nitride semiconductor layer 10 and the p-side nitride semiconductor layer 20. The n-side nitride semiconductor layer 10 includes a base layer 2, an n-side contact layer 3, and an n-side superlattice layer 4. The p-side nitride semiconductor layer 20 includes a p-type barrier layer 6 and a p-side contact layer 7. The active layer 5 in the nitride semiconductor light emitting element of the present disclosure will be explained first, followed by the detailed description of the substrate 1, the n-side nitride semiconductor layer 10, and the p-side nitride semiconductor layer 20 in succession.

Active Layer 5

The active layer 5 includes a plurality of stacks 5bw each including a well layer and one or more barrier layers. In the embodiment illustrated in FIG. 2, a stack structure has four stacks 5bw, in each of which a well layer is stacked on barrier layers.

A nitride semiconductor containing In may be used as a well layer as an example, and suitably setting the In composition ratio allows for the emission of blue to green light. In the case of using ($In_XAl_YGa_{1-X-Y}N$ (0≤X, 0≤Y, X+Y≤1), for example, by setting the In composition ratio x to a desired value, the peak emission wavelength within a range of 430 nm to 570 nm for the nitride semiconductor light emitting element can be achieved, for example, within a range of 500 nm to 570 nm for green light emission.

The well layers (see FIG. 2) in the active layer 5 include a plurality of first well layers 5w1 (two layers in the example shown in FIG. 2) positioned closer to the n-side nitride semiconductor layer 10, and a plurality of second well layers 5w2 (two layers in the example shown in FIG. 2) positioned closer to the p-side nitride semiconductor layer 20 than the first well layers 5w1. In order to reduce the decomposition of InGaN in the first well layers 5w1 and the second well layers 5w2, an interlayer 5c may be stacked on each well layer.

The first well layers 5w1 may have reduced contribution to emission as compared to the well layers closer to the p-side nitride semiconductor layer 20 than the first well layers 5w1. The thickness of each first well layer 5w1 is set to fall, for example, within a range of 0.5 to 4.0 nm, preferably within a range of 1.0 to 2.5 nm, more preferably within a range of 1.2 to 1.9 nm. In the embodiment illustrated in FIG. 2, the thickness is set as 1.6 nm.

The second well layers 5w2 are the layers that allow for efficient recombination of the electrons supplied via the first well layers 5w1 and the holes supplied from the p-side nitride semiconductor layer 20 to thereby achieve high output light emission. The second well layers 5w2 may have a larger thickness than the first well layers 5w1. Forming the second well layers 5w2 thicker than the first well layer 5w1 can increase the quantity of electrons that are recombined with holes in the second well layers that readily contribute to light emission. The thickness of each second well layer 5w2 is set to fall, for example, within a range of 1.5 to 5.5 nm, preferably within a range of 2.0 to 4.0 nm range, more preferably within a range of 2.5 to 3.2 nm. In the embodiment illustrated in FIG. 2, the thickness is set as 3.0 nm.

The barrier layers in the active layer 5 are formed of a material that can trap carriers in the well layers, and may be formed of, for example, GaN, InGaN, or AlGaN having a larger band gap than the well layers. The barrier layers are interposed between the well layers, and include in each stack a first barrier layer 5b1 positioned closer to the n-side nitride semiconductor layer 10 and a second barrier layer 5b2 positioned closer to the p-side nitride semiconductor than the first barrier layers 5b1.

The first barrier layers 5b1 contain an n-type impurity. The first barrier layers 5b1 containing an n-type impurity can reduce the forward voltage of the light emitting element. For the n-type impurity, for example, Si or Ge may be used, and in this embodiment, Si is used. With respect to the n-type impurity concentrations of the first barrier layers 5b1, the n-type impurity concentration of the first barrier layer 5b1 positioned between the first well layers 5w1 is set higher than the n-type impurity concentration of the first barrier layer 5b1 positioned between the second well layers 5w2. The n-type impurity concentration of the first barrier layer 5b1 positioned between the first well layers 5w1 may be set to fall, for example, within a range of $1.0 \times 10^{17}$ to $1.0 \times 10^{19}$/cm$^3$, preferably within a range of $3.0 \times 10^{17}$ to $5.0 \times 10^{18}$/cm$^3$, more preferably within a range of $5.0 \times 10^{17}$ to $2.0 \times 10^{18}$/cm$^3$. The n-type impurity concentration of the first barrier layer 5b1 positioned between the second well layers 5w2 may be set to fall, for example, within a range of $1.0 \times 10^{17}$ to $1.0 \times 10^{19}$/cm$^3$, preferably within a range of $3.0 \times 10^{17}$ to $5.0 \times 10^{18}$/cm$^3$, more preferably within a range of $4.0 \times 10^{17}$ to $1.0 \times 10^{18}$/cm$^3$. In the embodiment shown in FIG. 2 as an example, the n-type impurity concentration of the first barrier layer 5b1 positioned between the first well layers 5w1 is $1.3 \times 10^{18}$/cm$^3$ and n-type impurity concentration of the first barrier layer 5b1 positioned between the second well layers 5w2 is $8.8 \times 10^{17}$/cm$^3$.

The thickness of the first barrier layer 5b1 positioned between the first well layers 5w1 may be larger than the thickness of the first barrier layer 5b1 positioned between the second well layers 5w2. Making the first barrier layer 5b1 positioned between the first well layers 5w1 thicker than the first barrier layer 5b1 positioned between the second well layers 5w2 can facilitate the supply of holes to the second well layers 5w2 and the well layers near the center of the active layer that can readily contribute to light emission. The thickness of the first barrier layer 5b1 positioned between the first well layers 5w1 may be set to fall, for example, within a range of 5 to 30 nm range, preferably within a range of 10 to 25 nm, more preferably within a range of 14 to 18 nm. The thickness of the first barrier layer 5b1 positioned between the second well layers 5w2 may be set to fall, for example, within a range of 5 to 30 nm, preferably within a range of 6 to 16 nm, more preferably within a range of 8 to 11 nm. In the embodiment shown in FIG. 2 as an example, the thickness of the first barrier layer 5b1 positioned between the first well layers 5w1 is 15.8 nm, and the thickness of the first barrier layer 5b1 positioned between the second well layers 5w2 is 9.5 nm.

The second barrier layers 5b2 contain a lower concentration n-type impurity than the concentration of the n-type impurity in the first barrier layers 5b1. Furthermore, making the second barrier layer 5b2 positioned between the first well layers 5w1 an undoped semiconductor layer can reduce the crystallinity degradation of the second barrier layer 5b2 positioned between the first well layers 5w1 and the semiconductor layers formed onward. On the other hand, the n-type impurity concentration of the second barrier layer 5b2 positioned between the second well layers 5w2 may be set to fall, for example, within a range of $1.0 \times 10^{17}$ to $1.0 \times 10^{19}$/cm$^3$, preferably within a range of $2.0 \times 10^{17}$ to $1.0 \times 10^{18}$/cm$^3$, more preferably within a range of $3.0 \times 10^{17}$ to $8.0 \times 10^{17}$/cm$^3$. In the embodiment shown in FIG. 2 as an example, the n-type impurity concentration of the second barrier layer 5b2 positioned between the second well layers 5w2 is $6.3 \times 10^{17}$/cm$^3$. An undoped semiconductor layer means a semiconductor layer formed without supplying an n-type impurity gas during the process of forming the layer. Accordingly, a semiconductor layer incorporating the n-type impurity already present in the reaction chamber even if no n-type impurity gas is supplied during the forming process is also considered as an undoped semiconductor layer. For example, an undoped semiconductor layer can have an n-type impurity concentration of $1.7 \times 10^{17}$/cm$^3$ at most.

Furthermore, the thickness of the second barrier layer 5b2 positioned between the first well layers 5w1 may be set to fall, for example, within a range of 0.5 to 5.0 nm, preferably within a range of 0.5 to 1.5 nm, more preferably within a range of 0.5 to 0.8 nm. The thickness of the second barrier layer 5b2 positioned between the second well layers 5w2 may be set to fall, for example, within a range of 0.5 to 5.0 nm, preferably within a range of 0.5 to 1.5 nm, more preferably within a range of 0.5 to 0.8 nm. In the embodiment shown in FIG. 2 as an example, the second barrier layer 5b2 positioned between the first well layers 5w1, and the second barrier layer 5b2 positioned between the second well layers 5w2 are both 0.6 nm in thickness. The thicknesses are not limited to these examples, and they may have different thicknesses.

With respect to such an n-type impurity concentration relationship between the first barrier layer 5b1 and the second barrier layer 5b2, the n-type impurity concentration difference between the first barrier layer 5b1 and the second barrier layer 5b2 positioned between the first well layers 5w1 is set to be higher than the n-type impurity concentration difference between the first barrier layer 5b1 and the second barrier layer 5b2 positioned between the second well layers 5w2. In the embodiment shown in FIG. 2 as an example, the n-type impurity concentration difference between the first barrier layer 5b1 and the second barrier layer 5b2 positioned between the first well layers 5w1 is $1.3\times10^{18}/cm^3$ ($1.3\times10^{18}/cm^3$ for the first barrier layer and the second barrier layer is an undoped semiconductor layer), and the n-type impurity concentration difference between the first barrier layer 5b1 and the second barrier layer 5b2 positioned between the second well layers 5w2 is $2.5\times10^{17}/cm^3$ ($8.8\times10^{17}/cm^3$ for the first barrier layer and $6.3\times10^{17}/cm^3$ for the second barrier layer).

Here, the reason for setting the n-type impurity concentrations as described above will be explained while considering the valence band of the active layer. In the valence band of a semiconductor constructed with an undoped semiconductor layer as a barrier layer, the large energy level gap between a well layer and a barrier layer makes it difficult for holes to go over the barrier layer. As a result, holes are not readily supplied to the well layers near the center of the active layer.

On the other hand, in the case of the valence band constructed with a first barrier layer 5b1 containing an n-type impurity and a second barrier layer 5b2 containing a lower concentration n-type impurity than the concentration of the n-type impurity in the first barrier layer 5b1 as the barrier layers positioned between the second well layers 5w2, the energy level can be reduced at the position where the well layers and the barrier layers are adjacent. This can make the differences between the energy levels of the well layers and the energy levels of the barrier layers smaller as compared to the case in which the barrier layers are undoped semiconductor layers. As a result, holes can readily go over the barrier layers. This can facilitate the supply of electrons even to the well layers near the center of the active layer, thereby improving the light emission efficiency. Furthermore, with respect to the barrier layers positioned between the first well layers 5w1, by making the second barrier layer 5b2 an undoped layer or have a lower n-type impurity concentration than that of the second barrier layer 5b2 positioned between the second well layers 5w2, the degradation of semiconductor crystallinity attributable to doping with an n-type impurity can be reduced. As a result, the n-type impurity concentration difference between the first barrier layer and the second barrier layer positioned between the first well layers is larger than the n-type impurity concentration difference between the first barrier layer and the second barrier layer positioned between the second well layers.

Next, the constituent elements other than the active layer 5 in the nitride semiconductor light emitting element according to the present disclosure will be explained.

Undoped Semiconductor Layer 5u

An undoped semiconductor layer 5u may be disposed between the p-side nitride semiconductor layer 20 and the second well layer 5w2 that is closest to the p-side nitride semiconductor layer 20. Providing an undoped semiconductor layer 5u can suppress the diffusion of the p-type impurity from the p-side nitride semiconductor layer 20 into the active layer 5, thereby reducing the degradation of the reliability of the light emitting element. The material for the undoped semiconductor layer 5u can be any that can properly reduce the diffusion of the p-type impurity, and from the standpoint of the ease of film forming, the same material for the first and second barrier layers (GaN, InGaN, AlGaN, or the like) may be used. A different material may be used. The thickness of the undoped semiconductor layer 5u may be set to fall, for example, within a range of 0.5 to 15 nm, preferably within a range of 2 to 10 nm, more preferably within a range of 4 to 6 nm.

Substrate 1

For the substrate 1 (see FIG. 1), for example, an insulating substrate, such as sapphire and spinel ($MgAl_2O_4$) having C-, R-, or A-plane as a main surface can be used. Among them, in the case of using a nitride semiconductor for the nitride semiconductor light emitting element 100, a C-plane sapphire substrate is preferably used. As the substrate 1, SiC (including 6H, 4H, 3C), ZnS, ZnO, GaAs, Si or the like may alternatively be used. The light emitting element does not have to include a substrate 1 at the end.

N-Side Nitride Semiconductor Layer 10

Figure 2:
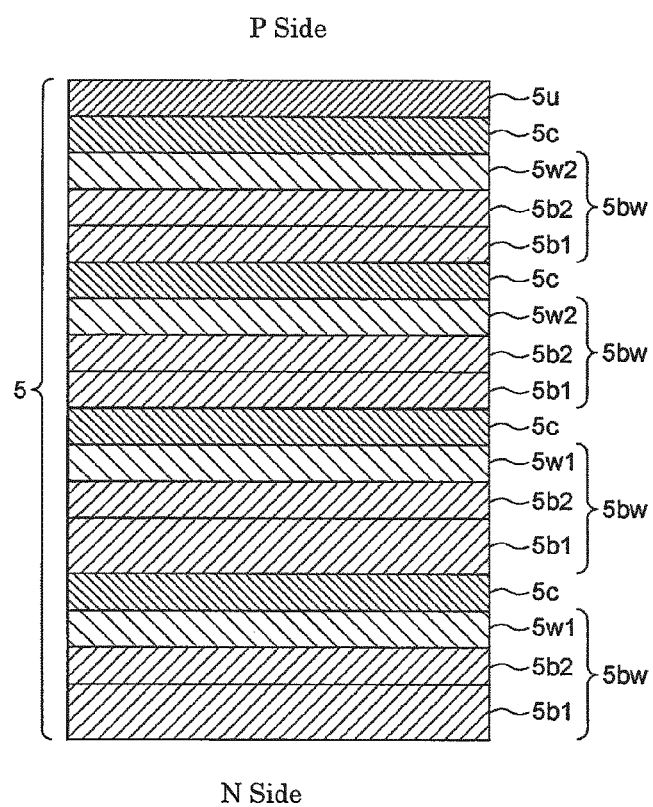
FIG. 2 is a schematic diagram of the structure of the active layer of a nitride semiconductor light emitting element according to a first embodiment of the present disclosure.

As shown in FIG. 1, the n-side nitride semiconductor layer 10 includes successively from the substrate 1 side, a base layer 2, an n-side contact layer 3, and an n-side superlattice layer 4. The n-side nitride semiconductor layer 10 includes at least one n-type semiconductor layer containing an n-type impurity. For the n-type impurity, for example, Si, Ge or the like can be used.

The base layer 2 is disposed between the substrate 1 and the n-side contact layer 3. Providing a base layer 2 allows for the formation of a high crystallinity n-side contact layer 3 on the upper face of the base layer 2. The base layer 2 may be, for example, AlGaN or GaN. A buffer layer may be formed between the base layer 2 and the substrate 1. The buffer layer is a layer for reducing the lattice mismatch between the substrate 1 and the base layer 2, and for example, undoped AlGaN or GaN can be used.

The n-side contact layer 3 is disposed on the upper face of the base layer 2, and contains an n-type impurity at least in one portion. As shown in FIG. 1, an n-electrode 8 is formed on the upper face of the n-side contact layer 3. Because the n-side contact layer 3 supplies electrons from the n-electrode 8 to the active layer 5, it is preferably doped with a relatively high concentration of an n-type impurity. The n-type impurity concentration of the n-side contact layer 3 can be set to fall, for example, within a range of $6\times10^{18}$ to $1\times10^{19}/cm^3$. The n-side contact layer 3 is preferably formed of GaN, AlGaN, AlN, or InGaN. The n-side contact layer 3 may have a multilayer structure in which, for example, undoped GaN and GaN doped with an n-type impurity are alternately stacked. The thickness of the n-side contact layer 3 may be, for example, 5 μm to 20 μm.

The n-side superlattice layer 4 is disposed on the upper face of the n-side contact layer 3. Providing an n-side superlattice layer 4 can reduce lattice relaxation between the n-side contact layer 3 and the active layer 5, thereby improving the crystallinity of the active layer 5. The n-side superlattice layer 4 has a structure in which semiconductor layers having different lattice constants are alternately stacked. The n-side superlattice layer 4 includes, for example, n pairs of an undoped InGaN layer and an undoped GaN layer. The quantity of pairs n may be set to fall, for example, within a range of 10 to 40, preferably within a range of 15 to 35, more preferably within a range of 25 to 35.

P-Side Nitride Semiconductor Layer 20

As shown in FIG. 1, the p-side nitride semiconductor layer 20 includes a p-type barrier layer 6 and a p-side contact layer 7 successively from the active layer 5 side. The p-side nitride semiconductor layer 20 includes at least one p-type semiconductor layer containing a p-type impurity. For the p-type impurity, for example, Mg or the like can be used.

The p-type barrier layer 6 of the p-side nitride semiconductor layer 20 is positioned closest to the active layer 5. The p-type barrier layer 6 is a layer disposed to trap electrons, and may be constructed with, for example, GaN or AlGaN containing a p-type impurity such as Mg or the like. The band gap energy of the p-type barrier layer 6 is larger than the band gap energy of the first barrier layers 5b1 in the active layer 5. The thickness of the p-type barrier layer 6 can be, for example, 10 nm to 50 nm. The p-type impurity concentration of the p-type barrier layer 6 can be set, for example, to $2\times10^{20}/cm^3$ to $6\times10^{20}/cm^3$.

The p-side contact layer 7 is a layer on which a p-electrode 9 is formed. The p-side contact layer 7 may be constructed with, for example, GaN or AlGaN containing a p-type impurity such as Mg. The thickness of the p-side contact layer 7 may be, for example, 10 nm to 150 nm.

As explained above, according to the nitride semiconductor light emitting element 100 of this embodiment, holes can be more readily supplied to the well layers near the center of the active layer. This can facilitate efficient electron-hole recombination in the well layers near the center of the active layer, thereby improving the light emission efficiency. Moreover, the degradation of the crystallinity of the semiconductor layers can be reduced.

Second Embodiment

Next, a second embodiment of the present disclosure will be explained with reference to FIG. 3. The explanation of the same constituent elements as those in the first embodiment (the substrate 1, the base layer 2 disposed on the substrate 1, the n-side nitride semiconductor layer 10, and the p-side nitride semiconductor layer 20) will be omitted.

Figure 3:
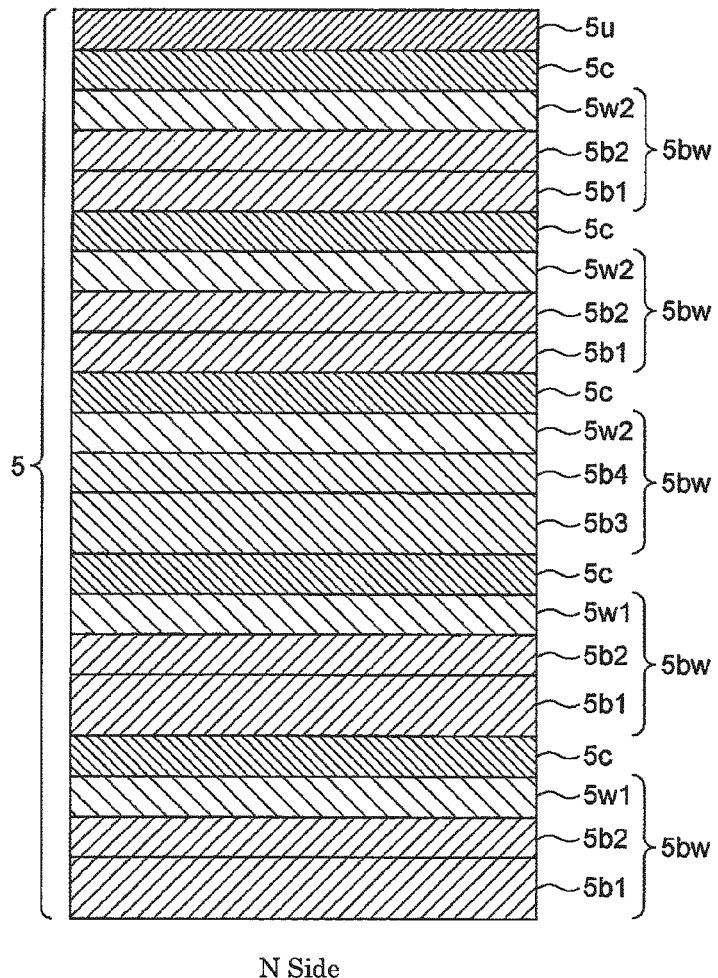
FIG. 3 is a schematic diagram of the structure of the active layer of a nitride semiconductor light emitting element according to a second embodiment of the present disclosure.

The well layers in the active layer of the second embodiment, for example, may include two first well layers 5w1 and three second well layers 5w2 as shown in FIG. 3. In other words, the quantity of the second well layers 5w2 is greater than the quantity of the first well layers 5w1. The quantity of the first well layers 5w1 and the second well layers 5w2 is not limited to this as long as the quantity of the second well layers 5w2 that contribute to light emission is greater than the quantity of the first well layers 5w1. For example, there may be five first well layers 5w1 and eight second well layers 5w2. Such a layering structure can increase the quantity of second well layers 5w2 that readily contribute to light emission, thereby increasing the amount of light emitted by the second well layers 5w2.

In this embodiment, between the first well layer 5w1 positioned closest to the p-side nitride semiconductor layer 20 and the second well layer 5w2 positioned closest to the n-side nitride semiconductor layer, a third barrier layer 5b3 and a fourth barrier layer 5b4 that is positioned closer to the p-side nitride semiconductor layer 20 than the third barrier layer 5b3 may be included (see FIG. 3).

The third barrier layer 5b3 contains an n-type impurity. The n-type impurity concentration of the third barrier layer 5b3 may be set to fall, for example, within a range of $1.0\times10^{17}$ to $1.0\times10^{19}/cm^3$, preferably within a range of $2.0\times10^{17}$ to $1.0\times10^{18}/cm^3$, more preferably within a range of $3.0\times10^{17}$ to $8.0\times10^{17}/cm^3$. In the embodiment shown in FIG. 3 as an example, the n-type impurity concentration of the third barrier layer 5b3 is $6.3\times10^{17}/cm^3$. The thickness of the third barrier layer 5b3 may be set to fall, for example, within a range of 5 to 30 nm, preferably within a range of 10 to 20 nm, more preferably within a range of 13 to 16 nm. In the embodiment shown in FIG. 3 as an example, the thickness of the third barrier layer 5b3 is 15.75 nm.

The fourth barrier layer 5b4 contains an n-type impurity. The n-type impurity concentration of the fourth barrier layer 5b4 may be set to fall, for example, within a range of $1.0\times10^{17}$ to $1.0\times10^{19}/cm^3$, preferably within a range of $2.0\times10^{17}$ to $1.0\times10^{18}/cm^3$, more preferably within a range of $3.0\times10^{17}$ to $8.0\times10^{17}/cm^3$. In the embodiment shown in FIG. 3 as an example, the n-type impurity concentration of the fourth barrier layer 5b4 is $6.3\times10^{17}/cm^3$. The thickness of the fourth barrier layer 5b4 may be set to fall, for example, within a range of 0.5 to 5.0 nm, preferably within a range of 0.5 to 1.5 nm, more preferably within a range of 0.5 to 0.8 nm. In the embodiment shown in FIG. 3 as an example, the thickness of the fourth barrier layer 5b4 is 0.6 nm.

In this embodiment, the thickness of the third barrier layer 5b3 may be set larger than the thickness of each first barrier layer 5b1 positioned between the second well layers 5w2. In the embodiment shown in FIG. 3 as an example, the thickness of each first barrier layer 5b1 positioned between the second well layers 5w2 is 9.5 nm as compared to the thickness of the third barrier layer 5b3 that is 15.75 nm. Forming the third barrier layer 5b3 thicker than the first barrier layers 5b1 positioned between the second well layers 5w2 can improve the crystallinity of the third barrier layer 5b3 and the layers formed onward. The crystallinity can be evaluated based on, for example, an x-ray diffraction (XRD) spectrum analysis. Sharp diffraction peaks appear when a layer subject to measurement has a high degree of crystallinity, and broad diffraction peaks appear when the layer has a low degree of crystallinity.

In this embodiment, furthermore, the n-type impurity concentration of the third barrier layer 5b3 is lower than the n-type impurity concentration of the first barrier layer 5b1 positioned between the first well layers 5w1. Making the n-type impurity concentration of the third barrier layer 5b3 lower than the n-type impurity concentration of the first barrier layer 5b1 positioned between the first well layers 5w1 can improve the crystallinity of the third barrier layer 5b3 and the layers formed onward. In the embodiment shown in FIG. 3 as an example, the n-type impurity concentration of the third barrier layer 5b3 is $6.3\times10^{17}/cm^3$ as compared to the n-type impurity concentration of the first barrier layer 5b1 positioned between the first well layers 5w1 of $1.3\times10^{18}/cm^3$. The second barrier layer 5b2 positioned between the first well layers 5w1 is preferably an undoped semiconductor layer to allow holes to be readily supplied to the second well layers 5w2 and the well layers near the center of the active layer that readily contribute to light emission.

Similar to the first embodiment 1, an undoped semiconductor layer 5u may be disposed between the p-side nitride semiconductor layer 20 and the second well layer 5w2 closest to the p-side nitride semiconductor layer 20.

Method of Manufacturing Nitride Semiconductor Light Emitting Element

Figure 4:
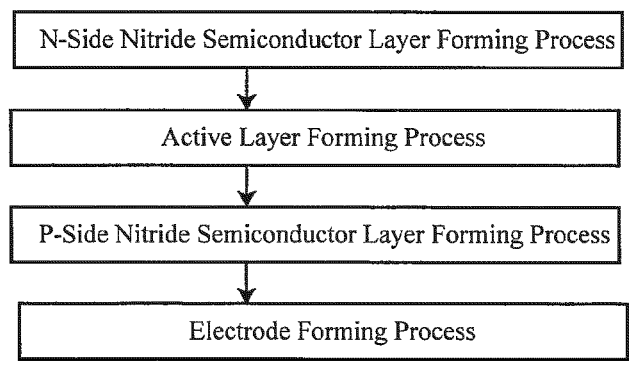
FIG. 4 is a process flowchart for manufacturing a nitride semiconductor light emitting element according to the present disclosure.

A method of manufacturing a nitride semiconductor light emitting element according to the present disclosure, as shown in FIG. 4, includes forming an n-side nitride semiconductor layer, forming an active layer, forming a p-side nitride semiconductor layer, and forming an electrode. The n-side nitride semiconductor layer forming process includes forming a base layer, forming an n-side contact layer, and forming an n-side superlattice layer. The p-side nitride semiconductor layer forming process includes forming a p-type barrier layer and forming a p-side contact layer. The method of manufacturing a nitride semiconductor light emitting element according to the present disclosure will be explained below in succession. Specifically, the method of manufacturing the embodiment illustrated in FIG. 3 will be explained.

N-Side Nitride Semiconductor Layer Forming Process

Base Layer Forming Process

For example, a base layer 2 is formed on the C-plane of a sapphire substrate 1 by metal-organic chemical vapor deposition (MOCVD). A buffer layer may be formed on the substrate 1 before forming a base layer 2, followed by forming a base layer 2 via the buffer layer. Here, the buffer layer is formed by growing AlGaN on the substrate 1, for example, by setting the growth temperature at 600° C. at most and using TMA (trimethyl aluminum), TMG (trimethyl gallium), and ammonia as source gases. The base layer 2 is formed by growing a GaN layer on the buffer layer by using, for example, TMG and ammonia as source gases.

N-Side Contact Layer Forming Process

In the process of forming an n-side contact layer, an n-side contact layer 3 is formed by growing a GaN layer doped with an n-type impurity. In growing a GaN layer doped with an n-type impurity, TMG and ammonia are used as source gases, and monosilane as an n-type impurity gas. The growth temperature for the n-side contact layer 3 may be set, for example, at 1150° C.

N-Side Superlattice Layer Forming Process

In the process of forming an n-side superlattice layer, an n-side superlattice layer 4 is formed by alternately stacking undoped GaN layers and undoped InGaN layers. The growth temperature for the n-side superlattice layer 4 is preferably set lower than the growth temperature for the n-side contact layer 3 and can be set, for example, at about 910° C. In growing undoped GaN layers, TEG (triethyl gallium), ammonia, and the like are used as source gases. In growing undoped InGaN layers, TEG, TMI (trimethyl indium), ammonia and the like are used as source gases. When growing undoped GaN layers, a gas containing $H_2$ may be used as a carrier gas. Using such a carrier gas can reduce the formation of V-pits on the surface of a GaN layer. Here, V-pits refer to recess-shaped pits created on the surface of a semiconductor layer attributable to the dislocation generated in the semiconductor layer.

Active Layer Forming Process

Barrier Layer Forming Process

The barrier layer forming process includes forming a first barrier layer containing an n-type impurity, and forming a second barrier layer positioned closer to the p-side nitride semiconductor layer than the first barrier layer.

In the first barrier layer forming process, a first barrier layer containing an n-type impurity is formed at the forming temperature of 910° C. to 1010° C. In order to allow the first barrier layer to contain an n-type impurity, GaN containing an n-type impurity may be formed by using monosilane as an n-type impurity gas. The gas flow rate may be set to about 7 sccm and the pressure in the chamber about 600 Torr to allow the n-type impurity concentration of the first barrier layer 5b1 positioned between the first well layers 5w1 to fall within a range of $5.0 \times 10^{17}/cm^3$ to $2.0 \times 10^{18}/cm^3$. The gas flow rate may be set to about 5 sccm and the pressure in the chamber about 600 Torr to allow the n-type impurity concentrations of the first barrier layers 5b1 positioned between the second well layers 5w2 to fall within a range of $4.0 \times 10^{17}/cm^3$ to $1.0 \times 10^{18}/cm^3$. In other words, in the process of forming the first barrier layers, the barrier layers are formed such that the n-type impurity concentration of the first barrier layer 5b1 positioned between the first well layers 5w1 is higher than the n-type impurity concentrations of the first barrier layers 5b1 positioned between the second well layers 5w2.

In the second barrier layer forming process, a second barrier layer containing an n-type impurity is formed at the forming temperature of 780° to 830° C. In other words, for the process of forming the second barrier layers, the forming temperature is set lower than the forming temperature for the process of forming the first barrier layers. Moreover, the n-type impurity gas flow rate in forming the second barrier layers can be set lower than the n-type impurity gas flow rate in forming the first barrier layers. Here, for the second barrier layer 5b2 positioned between the first well layers 5w1, an undoped semiconductor layer may be formed. On the other hand, in the case of forming a second barrier layer 5b2 positioned between the second well layers 5w2, GaN containing an n-type impurity may be formed by using monosilane for adding the n-type impurity. The gas flow rate may be set at about 1 sccm and the pressure in the chamber at about 600 Torr in order to allow the n-type impurity concentration of the second barrier layers 5b2 positioned between the second well layers 5w2 to fall within a range of $3.0 \times 10^{17}/cm^3$ to $8.0 \times 10^{17}/cm^3$.

In the barrier layer forming process, with respect to the n-type impurity concentration relationship between the first barrier layers 5b1 and the second barrier layers 5b2, the barrier layers are formed such that the difference between the n-type impurity concentration of the first barrier layer 5b1 and the n-type impurity concentration of the second barrier layer 5b2 that are positioned between the first well layers 5w1 is larger than the difference between the n-type impurity concentrations of the first barrier layers 5b1 and the n-type impurity concentrations of the second barrier layers 5b2 that are positioned between the second well layers 5w2.

As another method of accomplishing the n-type impurity concentration relationship between the first barrier layers 5b1 and the second barrier layers 5b2 described above, the n-type impurity gas flow rate when forming the first barrier layer positioned between the first well layers may be set higher than the n-type impurity gas flow rate when forming the first barrier layers positioned between the second well layers.

Furthermore, a first barrier layer 5b1 is formed at a relatively high temperature (910° C. to 1010° C.), and a second barrier layer 5b2 is formed on the first barrier layer 5b1 at a relatively low temperature (780° C. to 830° C.), and a well layer is formed on the second barrier layer 5b2, This can reduce the crystallinity degradation of the well layer. The reason for this will be explained now. Barrier layers need to be formed at a relatively high temperature in order to reduce crystallinity degradation. On the other hand, well layers need to be grown at a lower temperature than that for barrier layers in order to suppress the group III elements from being released. Lowering the temperature to that suited for forming a well layer by suspending semiconductor formation after forming a barrier layer might raise a concern of generating crystal defects attributable to the suspension of semiconductor layer formation. Accordingly, it is considered possible to reduce crystallization degradation by burying the crystal defects, which are caused by suspending semiconductor layer formation after forming a barrier layer at a relatively high temperature, with a barrier layer formed at a relatively low temperature. This can consequently reduce the light emission efficiency decline attributable to crystallinity degradation. Furthermore, doping the barrier layer with an n-type impurity as described above can reduce the energy level difference between the well layer and the barrier layer. By also doping a barrier layer formed at a relatively low temperature with an n-type impurity, the energy level difference between the well layer and the barrier layer can be further reduced. Furthermore, doping the barrier layer with a lower concentration n-type impurity than that of the barrier layer formed at a relatively high temperature can suppress the crystallinity degradation attributable to doping with an n-type impurity while reducing the energy level difference between the well layer and the barrier layer.

The barrier layer forming process in manufacturing the second embodiment described above may include forming a third barrier layer 5b3 and a fourth barrier layer 5b4 positioned closer to the p-side nitride semiconductor layer than the third barrier layer 5b3. The third barrier layer 5b3 and the fourth barrier layer 5b4 are positioned between the first well layer 5w1 positioned closest to the p-side nitride semiconductor layer and the second well layer 5w2 positioned closest to the n-side nitride semiconductor layer.

In the process of forming a third barrier layer 5b3, the third barrier layer 5b3 containing an n-type impurity is formed at a forming temperature of 910° C. to 1010° C. In order to allow the third barrier layer 5b3 to contain an n-type impurity, GaN containing an n-type impurity may be formed by using monosilane as an n-type impurity gas. In order to make the n-type impurity concentration of the third barrier layer 5b3 to be $5.0 \times 10^{17}/cm^3$ to $2.0 \times 10^{18}/cm^3$ and the thickness to be 13 nm to 16 nm, the gas flow rate may be set to about 3 sccm and the pressure in the chamber about 600 Torr.

In the process of forming a fourth barrier layer 5b4, the fourth barrier layer 5b4 containing an n-type impurity is formed at a forming temperature of 780° C. to 830° C. In order to allow the fourth barrier layer 5b4 to contain an n-type impurity, GaN containing an n-type impurity may be formed by using monosilane as an n-type impurity gas. In order to make the n-type impurity concentration of the fourth barrier layer 5b4 to be $5.0 \times 10^{17}/cm^3$ to $2.0 \times 10^{18}/cm^3$ and the thickness to be 0.5 nm to 0.8 nm, the gas flow rate may be set to about 1 sccm and the pressure in the chamber about 600 Torr.

In this manner, the thickness of the third barrier layer 5b3 is made larger than those of the first barrier layers 5b1 positioned between the well layers 5w2, and the n-type impurity concentration of the third barrier layer 5b3 is made lower than the n-type impurity concentration of the first barrier layer positioned between the first well layers 5w1. This can improve the crystallinity of the third barrier layer 5b3 and the layers formed onward.

The barrier layer forming process may include forming an undoped semiconductor layer 5u between the p-side nitride semiconductor layer and the second well layer 5w2 closest to the p-side nitride semiconductor layer. Forming an undoped semiconductor layer 5u can reduce the diffusion of the p-type impurity into the active layers 5.

The process of forming an undoped semiconductor layer 5u forms an undoped semiconductor layer without supplying an n-type impurity gas as compared to the process of forming the first barrier layer 5b1 positioned closest to the p-side nitride semiconductor layer; the forming temperature, the gas flow rate for anything other than the n-type impurity gas, and the pressure in the chamber can be set in substantially the same manner as those for forming the first barrier layer 5b1.

Well Layer Forming Process

The well layer forming process includes forming a plurality of first well layers and a plurality of second well layers 5w2 positioned closer to the p-side nitride semiconductor layer than the first well layers 5w1.

In the process of forming a first well layer, InGaN is formed by using TEG (triethyl gallium), TMI, and ammonia as source gases and setting the temperature at 780 to 830° C. In the process of forming a second well layer, InGaN is formed by using TEG, TMI, and ammonia as source gases and setting the temperature at 780 to 830° C. such that the quantity of the second well layers 5w2 is greater than the quantity of the first well layers 5w1. Because a larger quantity of second well layers 5w2 that tend to have greater contribution to light emission are formed in the well layer forming process, more light can be generated by the second well layers 5w2.

P-Side Nitride Semiconductor Layer Forming Process

P-Type Barrier Layer Forming Process

In the p-type barrier layer forming process, an AlGaN layer containing a p-type impurity is formed as a p-type barrier layer 6 by using, for example, TEG, TMA, and ammonia as source gases, and $Cp_2Mg$ (bis(cyclopentadienyl)magnesium) as a p-type impurity gas.

P-Side Contact Layer Forming Process

In the p-side contact layer forming process, an undoped GaN layer is grown by using, for example, TMG, TMA, and ammonia as source gases. Subsequently, a p-side contact layer 7 is formed on the undoped GaN layer by growing a GaN layer containing a p-type impurity by using TMG, TMA, and ammonia as source gases and $Cp_2Mg$ (bis(cyclopentadienyl)magnesium) as a p-type impurity gas. The impurity concentration of the p-side contact layer 7 is preferably set higher than that of the p-type barrier layer 6.

After growing the semiconductor layers in the processes described above, the wafer is annealed in a reaction chamber in a nitrogen atmosphere at a temperature, for example, of about 700° C.

Electrode Forming Process

After annealing, a portion of the surface of the n-side contact layer 3 is exposed by partially removing the p-side nitride semiconductor layer 20, the active layer 5, and the n-side nitride semiconductor layer 10.

Subsequently, a p-electrode 9 is formed on a portion of the surface of the p-side contact layer 7, and an n-electrode 8 is formed on a portion of the surface of the exposed n-side contact layer 3. By following the processes described above, a nitride semiconductor light emitting element 100 is produced.

As described above, the method of manufacturing a nitride semiconductor light emitting element according to the present embodiment can manufacture a nitride semiconductor light emitting element having improved light emission efficiency.

EXAMPLE

One preferable example of a nitride semiconductor light emitting element according to the present disclosure will be explained. As a substrate 1, a sapphire substrate was used. A buffer layer that is an undoped AlGaN layer was formed on the upper face of the substrate 1. A base layer 2 was formed on the buffer layer.

An n-side contact layer 3 was formed on the upper face of the base layer 2. The n-side contact layer 3 is a GaN layer doped with Si as an n-type impurity. The thickness of the n-side contact layer 3 was about 8 μm.

An n-side superlattice layer 4 was formed on the upper face of the n-side contact layer 3. An Si doped GaN layer of about 80 nm in thickness was formed. This was followed by forming 27 pairs of about a 3 nm thick undoped GaN layer and about a 1.5 nm thick undoped InGaN layer. Then three pairs of about a 3 nm thick undoped GaN layer and about a 1.5 nm thick Si doped InGaN layer were formed. Subsequently, six pairs of about a 10 nm thick Si doped AlGaN layer and about a 1 nm thick Si doped InGaN layer were formed. By forming these semiconductor layers, the n-side superlattice layer 4 including a plurality of semiconductor layers was formed.

An active layer 5 was formed on the upper face of the n-side superlattice layer 4.

First, about a 6 nm thick Si doped InGaN layer, about a 2.3 nm thick undoped GaN layer as a barrier layer, about a 0.6 nm thick undoped GaN layer as a barrier layer, about a 1.6 nm thick undoped InGaN layer as a well layer, and about a 1.6 nm thick undoped GaN layer as an interlayer were formed.

This was followed by forming about a 15.8 nm thick Si doped GaN layer (n-type impurity concentration: $7.0\times10^{17}/cm^3$) as a barrier layer, about a 0.6 nm thick undoped GaN layer as a barrier layer, about a 1.6 nm thick undoped InGaN layer as a first well layer 5w1, and about a 1.6 nm thick undoped GaN layer as an interlayer 5c.

Then about a 15.8 nm thick Si doped GaN layer as a first barrier layer 5b1, about a 0.6 nm thick undoped GaN layer as a second barrier layer 5b2, about a 1.6 nm thick undoped InGaN layer as a first well layer 5w1, and about a 1.6 nm thick undoped GaN layer as an interlayer 5c were formed. These processes of forming the first barrier layer 5b1, the second barrier layer 5b2, the first well layer 5w1, and the interlayer 5c were repeated three times. In this process, the n-type impurity concentration of each first barrier layer 5b1 was set to be $7.0\times10^{17}/cm^3$.

Then about a 15.8 nm thick Si doped GaN layer as a barrier layer (n-type impurity concentration: $7.0\times10^{17}/cm^3$), about a 0.6 nm thick Si doped GaN layer as a barrier layer (n-type impurity concentration: $3.5\times10^{17}/cm^3$), about a 3.0 nm thick undoped InGaN layer as a well layer, and about a 1.6 nm thick undoped GaN layer as an interlayer were formed.

Then about a 15.8 nm thick Si doped GaN layer as a third barrier layer 5b3 (n-type impurity concentration: $3.5\times10^{17}/cm^3$), about a 0.6 nm thick Si doped GaN layer as a fourth barrier layer 5b4 (n-type impurity concentration: $3.5\times10^{17}/cm^3$), about a 3.0 nm thick undoped InGaN layer as a well layer, and about a 1.6 nm thick undoped GaN layer as an interlayer were formed.

This was followed by forming about a 15.8 nm thick Si doped GaN layer as a third barrier layer 5b3 (n-type impurity concentration: $3.5\times10^{17}/cm^3$), about a 0.6 nm thick Si doped GaN layer as a fourth barrier layer 5b4 (n-type impurity concentration: $3.5\times10^{17}/cm^3$), about a 3.0 nm thick undoped InGaN layer as a second well layer 5w2, and about a 1.6 nm thick undoped GaN layer as an interlayer 5c.

Then about a 9.5 nm thick Si doped GaN layer as a first barrier layer 5b1, about a 0.6 nm thick Si doped GaN layer as a second barrier layer 5b2, about a 3.0 nm thick undoped InGaN layer as a second well layer 5w2, and about a 1.6 nm thick undoped GaN layer as an interlayer 5c were formed. These process of forming the first barrier layer 5b1, the second barrier layer 5b2, the second well layer 5w2, and the interlayer 5c were repeated four times. In this process, the n-type impurity concentration of each first barrier layer 5b1 was set to be $4.9\times10^{17}/cm^3$ and the n-type impurity concentration of each second barrier layer 5b2 was set to be $3.5\times10^{17}/cm^3$.

Subsequently, about a 9.5 nm thick Si doped GaN layer as a barrier layer (n-type impurity concentration: $4.9\times10^{17}/cm^3$), about a 0.6 nm thick undoped GaN layer as a barrier layer, about a 3.4 nm thick undoped InGaN layer as a well layer, about a 1.6 nm thick undoped GaN layer as an interlayer, and about an 18.4 nm thick undoped GaN layer as an undoped semiconductor layer 5u were formed. By forming the semiconductor layers described above, an active layer 5 that included a plurality of semiconductor layers was formed.

In forming the active layer 5, the forming temperature for the barrier layers (including the first barrier layers 5b1) adjacent to the interlayers was set to be 910° C. to 1010° C., and the forming temperature for the barrier layers (including the second barrier layers 5b2) immediately under the well layers was set to be 780° C. to 830° C.

On the upper face of the active layer 5, a p-type barrier layer 6 of about 11 nm in thickness was formed. The p-type barrier layer 6 is an AlGaN layer containing Mg as a p-type impurity. In the p-type barrier layer 6, the Al percentage was set to be about 12.5%.

On the upper face of the p-type barrier layer 6, a p-side contact layer 7 was formed. About an 80 nm thick undoped GaN was formed, that was followed by forming Mg doped GaN of about 20 nm in thickness.

After growing the semiconductor layers as described above, the wafer was heat treated in the reaction chamber in a nitrogen atmosphere at about 700° C.

After the heat treatment, a portion of the surface of the n-side contact layer 3 was exposed by partially removing the p-side nitride semiconductor layer 20, the active layer 5, and the n-side nitride semiconductor layer 10.

Subsequently, a p-electrode 9 was formed on a portion of the surface of the p-side contact layer 7, and an n-electrode 8 was formed on a portion of the exposed surface of the n-side contact layer 3.

In such an example, the n-type impurity concentration of the first barrier layers 5b1 positioned between the first well layers 5w1 ($7.0\times10^{17}/cm^3$) is higher than the n-type impurity concentration of the first barrier layers 5b1 positioned between the second well layers 5w2 ($4.9\times10^{17}/cm^3$).

In the present example, furthermore, the n-type impurity concentration difference between the first barrier layers 5b1 and the second barrier layers 5b2 positioned between the first well layers 5w1 ($7.0\times10^{17}/cm^3$) is larger than the n-type impurity concentration difference between the first barrier layers 5b1 and the second barrier layers 5b2 positioned between the second well layers 5w2 ($1.4\times10^{17}/cm^3$).

In the present example, moreover, the thickness of each first barrier layer 5b1 positioned between the first well layers 5w1 (about 15.8 nm) is larger than the thickness of each first barrier layer 5b1 positioned between the second well layers 5w2 (about 9.5 nm).

In the present example, an undoped semiconductor layer 5u is further provided between the p-side nitride semiconductor layer and the second well layer 5w2 that is closest to the p-side nitride semiconductor layer among the plurality of second well layers 5w2.

In the present example, moreover, at least one of the barrier layers that are positioned between the first well layer 5w1 closest to the p-side nitride semiconductor layer and the second well layer 5w2 closest to the n-side nitride semiconductor layer includes a third barrier layer 5b3 containing an n-type impurity and a fourth barrier layer 5b4 containing an n-type impurity and positioned closer to the p-side nitride semiconductor than the third barrier layer 5b3.

The thickness of the third barrier layer 5b3 (about 15.8 nm) is larger than the thickness of the first barrier layers (about 9.5 nm) positioned between the second well layers 5w2, and the n-type impurity concentration of the third barrier layer 5b3 ($3.5\times10^{17}/cm^3$) is lower than the n-type impurity concentration of the first barrier layers 5b1 positioned between the first well layers 5w1 ($7.0\times10^{17}/cm^3$).

In the present example, the quantity of second well layers 5w2 (5 layers) is greater than the quantity of first well layers 5w1 (4 layers).

In the present example, moreover, the second barrier layers 5b2 positioned between the first well layers 5w1 are undoped semiconductor layers.

In the present example, the n-type impurity is Si.

In the present example described above, the light emission efficiency of the nitride semiconductor light emitting element measured when applying a 100 mA current was 43.9%.

The embodiments disclosed in the foregoing are provided for exemplification purposes in every respect, and do not constitute any ground for limited interpretations. Accordingly, the technical scope of the present invention shall not be interpreted based solely on the embodiments described above, but rather is defined by the scope of claims. The technical scope of the present invention encompasses the meanings equivalent to the scope of claims and all modifications that can be made within the scope of the claims.

What is claimed is:

1. A nitride semiconductor light emitting element comprising:
    an n-side nitride semiconductor layer;
    a p-side nitride semiconductor layer; and
    an active layer disposed between the n-side nitride semiconductor layer and the p-side nitride semiconductor layer, wherein:
    the active layer includes a plurality of well layers and a plurality of barrier layers,
    the plurality of well layers include a plurality of first well layers, and a plurality of second well layers positioned closer to the p-side nitride semiconductor layer than the first well layers,
    at least one of the plurality of barrier layers positioned between the first well layers includes a first barrier layer containing an n-type impurity, and a second barrier layer, wherein a concentration of the n-type impurity in the second barrier layer located between the first well layers is lower than a concentration of the n-type impurity in the first barrier layer located between the first well layers, and wherein the second barrier layer located between the first well layers is positioned closer to the p-side nitride semiconductor layer than the first barrier layer located between the first well layers,
    at least one of the plurality of barrier layers positioned between the second well layers includes a first barrier layer containing an n-type impurity, and a second barrier layer, wherein a concentration of the n-type impurity in the second barrier layer located between the second well layers is lower than a concentration of the n-type impurity in the first barrier layer located between the second well layers, and wherein the second barrier layer located between the second well layers is positioned closer to the p-side nitride semiconductor layer than the first barrier layer located between the second well layers,
    the n-type impurity concentration of the first barrier layer positioned between the first well layers is higher than the n-type impurity concentration of the first barrier layer positioned between the second well layers, and
    an n-type impurity concentration difference between the first barrier layer and the second barrier layer positioned between the first well layers is greater than an n-type impurity concentration difference between the first barrier layer and the second barrier layer positioned between the second well layers.

2. The nitride semiconductor light emitting element according to claim 1, wherein:
    a thickness of at the first barrier layer positioned between the first well layers is larger than a thickness of the first barrier layer positioned between the second well layers.

3. The nitride semiconductor light emitting element according to claim 1, wherein:
    an undoped semiconductor layer is located between the p-side nitride semiconductor layer and the second well layer that is closest to the p-side nitride semiconductor layer.

4. The nitride semiconductor light emitting element according to claim 1, wherein:
    at least one of the barrier layers positioned between the first well layer closest to the p-side nitride semiconductor layer and the second well layer closest to the n-side nitride semiconductor layer includes a third barrier layer containing an n-type impurity and a fourth barrier layer containing an n-type impurity and positioned closer to the p-side nitride semiconductor layer than the third barrier layer,
    a thickness of the third barrier layer is larger than a thickness of the first barrier layer positioned between the second well layers, and
    an n-type impurity concentration of the third barrier layer is lower than an n-type impurity concentration of the first barrier layer positioned between the first well layers.

5. The nitride semiconductor light emitting element according to claim 1, wherein a quantity of the second well layers is greater than a quantity of the first well layers.

6. The nitride semiconductor light emitting element according to claim 1, wherein:
    the second barrier layer positioned between the first well layers are undoped semiconductor layers.

7. The nitride semiconductor light emitting element according to claim 1, wherein:
    the n-type impurity is Si.

* * * * *